United States Patent
Tsao et al.

(10) Patent No.: US 8,081,476 B2
(45) Date of Patent: Dec. 20, 2011

(54) ELECTROMAGNETIC SHIELDING DEVICE WITH HEAT DISSIPATING FUNCTION

(75) Inventors: Wei-Chun Tsao, Taipei (TW); Chien-Ru Lin, Taipei (TW)

(73) Assignee: Unihan Corporation, Beitou District, Taipei (TW)

( * ) Notice: Subject to any disclaimer, the term of this patent is extended or adjusted under 35 U.S.C. 154(b) by 27 days.

(21) Appl. No.: 12/634,675

(22) Filed: Dec. 9, 2009

(65) Prior Publication Data

US 2010/0157544 A1    Jun. 24, 2010

(30) Foreign Application Priority Data

Dec. 22, 2008 (TW) .............................. 97150123 A

(51) Int. Cl.
*H05K 7/20* (2006.01)

(52) U.S. Cl. ........ 361/719; 361/707; 361/710; 361/721; 174/382; 257/713

(58) Field of Classification Search .................. 361/700, 361/704, 707, 709, 710, 715, 717, 719, 720, 361/721, 816, 818
See application file for complete search history.

(56) References Cited

U.S. PATENT DOCUMENTS

| | | | |
|---|---|---|---|
| 5,724,234 A * | 3/1998 | Phelps ........................ | 361/816 |
| 6,673,998 B1 * | 1/2004 | Wu .............................. | 174/383 |
| 7,515,424 B2 * | 4/2009 | Deng et al. ................... | 361/719 |
| 7,529,095 B2 * | 5/2009 | Whitton ....................... | 361/719 |
| 2002/0046850 A1 * | 4/2002 | Onoue ......................... | 174/35 R |
| 2005/0141211 A1 * | 6/2005 | Chen ............................ | 361/816 |
| 2007/0086170 A1 | 4/2007 | Liang | |

FOREIGN PATENT DOCUMENTS

CN    2872456    2/2007

* cited by examiner

*Primary Examiner* — Courtney Smith
(74) *Attorney, Agent, or Firm* — Winston Hsu; Scott Margo

(57) ABSTRACT

An electromagnetic shielding device with a heat dissipating function for shielding at least one electronic element on a circuit board is provided. The electromagnetic shielding device includes a frame, a cover, and a heat dissipating element. The frame is disposed on the circuit board and surrounds the electronic element, and the frame is one-piece and seamless. The cover has a top portion and a side portion bent from borders of the top portion. The heat dissipating element is disposed on the top portion. The top portion of the cover is connected to borders of the frame, and the side portion is tightly combined with the frame so that the cover, the frame and the circuit board form a shielding space to surround the electronic element.

8 Claims, 3 Drawing Sheets

ELECTROMAGNETIC SHIELDING DEVICE WITH HEAT DISSIPATING FUNCTION

CROSS-REFERENCE TO RELATED APPLICATIONS

This Non-provisional application claims priority under 35 U.S.C. §119(a) on Patent Application No(s). 097150123 filed in Taiwan, Republic of China on Dec. 22, 2008, the entire contents of which are hereby incorporated by reference.

BACKGROUND OF THE INVENTION

1. Field of the Invention

The invention relates to an electromagnetic shielding device with a heat dissipating function and, more particularly, to an electromagnetic shielding device with a heat dissipating function including a seamless frame capable of being tightly combined with a cover.

2. Description of the Related Art

Electromagnetic interference (EMI) is a common problem in an interior of an electronic product. In detail, an electronic element in the electronic product may usually generate electromagnetic waves during working, and the electromagnetic waves may affect signal quality and working performance of other electronic elements. Therefore, prevention against electromagnetic interference is an important detecting index of an electronic product.

A tuner is taken for example. When adjusting a working frequency of an electronic product, the tuner is easy to generate electromagnetic waves and affects performance of other electronic elements. In the same way, with improvement of a signal processing speed and concentration of circuits, the electromagnetic waves generated by the electronic elements also easily interfere with the frequency adjusting performance of the tuner.

In addition, to satisfy the needs of an electronic product with a small size and an integral function on the market, the tuner and a central processing unit need to be integrated into a single chip.

BRIEF SUMMARY OF THE INVENTION

This invention provides an electromagnetic shielding device with a heat dissipating function. Via a seamless frame and a cover tightly combined with the frame, the electromagnetic shielding device can prevent electromagnetic waves from leaking outside and prevent external electromagnetic waves from permeating inside, and it can also provide a heat dissipating function for an electronic element.

The invention provides an electromagnetic shielding device with a heat dissipating function for shielding at least one electronic element on a circuit board. The electromagnetic shielding device includes a frame, a cover, and a heat dissipating element. The frame is disposed on the circuit board and surrounds the electronic element, and the frame is one-piece and seamless. The cover has a top portion and a side portion bent from borders of the top portion. The heat dissipating element is disposed on the top portion. The cover is combined with the frame; the top portion of the cover is connected to borders of the frame; the side portion is tightly combined with the frame so that the cover, the frame, and the circuit board form a shielding space to surround the electronic element.

In one embodiment of the invention, the top portion of the cover may have an opening corresponding to the electronic element on the circuit board, and the outline of the opening may be a smooth closed curve. The heat dissipating element may have a protrudent block tightly embedded into the opening.

In one embodiment of the invention, the opening of the cover may be circular or elliptical.

In one embodiment of the invention, the electromagnetic shielding device with a heat dissipating function may further include a heat conducting element, and two opposite surfaces thereof may be connected to the electronic element and the protrudent block of the heat dissipating element, respectively.

In one embodiment of the invention, the top portion of the cover may have a recessed portion surrounding the borders of the top portion and may be adjacent to the frame so that the frame is sandwiched between the recessed portion and the side portion.

In one embodiment of the invention, the side portion of the cover may have at least one first fastening portion, and the frame may have at least one second fastening portion corresponding and fastened to the first fastening portion.

In one embodiment of the invention, the electronic element may include a central processing unit (CPU) with a tuning function.

In one embodiment of the invention, the heat dissipating element may be a heat dissipating fin.

According to the above, since the frame is seamless, and the frame is tightly combined with the side portion of the cover, the electromagnetic shielding device with a heat dissipating function can form a closed shielding space. In addition, the electromagnetic shielding device also has a heat dissipating element for directly dissipating heat for the shielded electronic element. Thereby, the electromagnetic shielding device can effectively prevent electromagnetic waves from leaking outside and prevent external electromagnetic waves from permeating inside. Besides having a better electromagnetic shielding function, the electromagnetic shielding device also has a heat dissipating function.

These and other features, aspects, and advantages of the present invention will become better understood with regard to the following description, appended claims, and accompanying drawings.

DETAILED DESCRIPTION OF THE INVENTION

Figure 1:
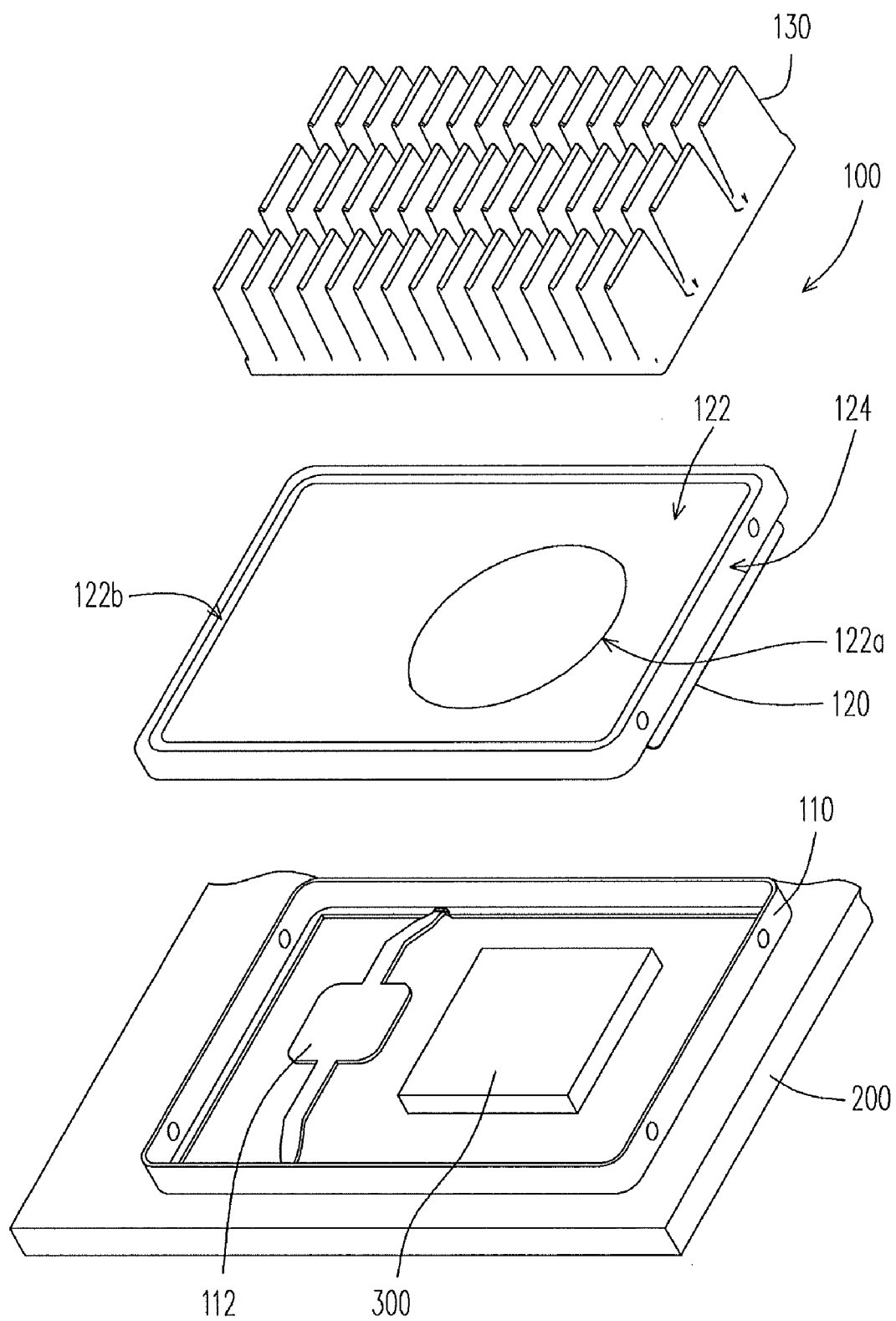
FIG. 1 is an exploded diagram showing an electromagnetic shielding device with a heat dissipating function according to one embodiment of the invention.

FIG. 1 is an exploded diagram showing an electromagnetic shielding device with a heat dissipating function according to one embodiment of the invention. Please refer to FIG. 1. The electromagnetic shielding device 100 with a heat dissipating function is used for shielding at least one electronic element 300 on a circuit board 200. The electromagnetic shielding device 100 includes a frame 110, a cover 120, and a heat dissipating element 130. The frame 110 is disposed on the circuit board 200 and surrounds the electronic element 300, and the frame 110 is one-piece and seamless. The cover 120 has a top portion 122 and a side portion 124 bent from borders of the top portion 122. The heat dissipating element 130 may be a heat dissipating fin disposed on the top portion 122 of the cover 120. The cover 120 is combined with the frame 110; the top portion 122 of the cover 120 is connected to borders of the frame 110; the frame 110 is tightly combined with the side portion 124 so that the cover 120, the frame 110, and the circuit board 200 form a shielding space to surround the electronic element 300.

In the electromagnetic shielding device 100 with a heat dissipating function in this embodiment of the invention, since the electromagnetic shielding device 100 has the one-piece and seamless frame 110, and the cover 120 is tightly combined with the frame 110 via the side portion 124, the cover 120, the frame 110, and the circuit board 200 form a closed shielding space. Thereby, the electromagnetic shielding device 100 with the heat dissipating function can block transmission of electromagnetic waves to prevent the electronic element 300 in the electromagnetic shielding device 100 with the heat dissipating function from being interfered with by external electromagnetic waves or to prevent electromagnetic waves generated by the electronic element 300 from interfering with other elements on the circuit board 200. In addition, the electromagnetic shielding device 100 also has a heat dissipating element 130. Therefore, besides having the electromagnetic shielding function, the electromagnetic shielding device 100 also can dissipate the heat generated by the electronic element 300 in the shielding space.

In this embodiment, the electronic element 300 may be a central processing unit (CPU) with a tuning function. The electromagnetic shielding device 100 is used for preventing external electromagnetic waves from permeating into the electromagnetic shielding device 100 thus to cause the failure of the tuning function of the central processing unit. In addition, the electromagnetic shielding device 100 may also have a memory or other electronic elements.

In addition, the frame 110 may be fastened to the circuit board 200 via a surface mount technology (SMT) or other proper modes and surround the electronic element 300. In this embodiment, the frame 110 has a drawing portion 112 disposed across the frame 110. When the frame 110 is fastened to the circuit board 200 via the SMT, the drawing portion 112 provides a drawable surface for a surface mount device to dispose the frame 110 on the circuit board 200.

In addition, in this embodiment, the frame 110 may be manufactured via integrally mold striping. The frame 110 manufactured via the integrally mold striping is seamless. Thus, bending and soldering a board to form the frame in the prior art can be avoided further to simplify the manufacturing process of the frame 110. Furthermore, the seamless frame 110 improves the shielding ability of the electromagnetic shielding device 100.

Figure 2:
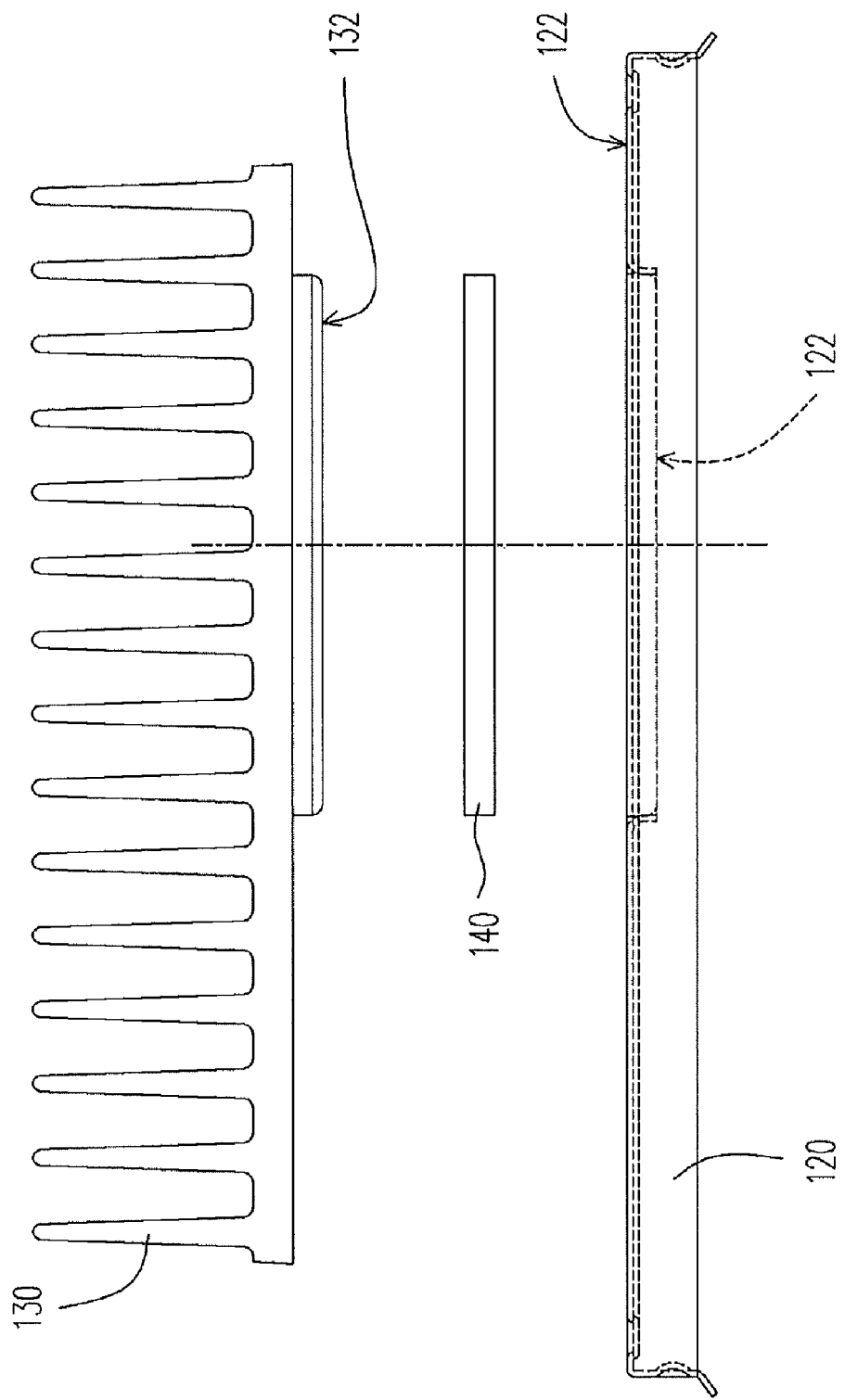
FIG. 2 is a partial side view showing the electromagnetic shielding device with a heat dissipating function in FIG. 1.

FIG. 2 is a partial side view showing the electromagnetic shielding device with a heat dissipating function in FIG. 1. Please refer to FIG. 1 and FIG. 2 together. In this embodiment, the top portion 122 of the heat dissipating element 130 further has an opening 122a corresponding to the electronic element 300 on the circuit board 200, and the heat dissipating element 130 has a protrudent block 132. The outline of the opening 122a is a smooth closed curve such as a circle or an ellipse, and the shape of the protrudent block 132 agrees with that of the opening 122a. Therefore, the protrudent block 132 of the heat dissipating element 130 can be tightly embedded into the opening 122a. In this embodiment, since the outline of the opening 122a is a smooth closed curve, the problem that the opening with other shapes may have connection gaps at corners can be solved.

In addition, the electromagnetic shielding device 100 with the heat dissipating function further includes a heat conducting element 140 disposed between the electronic element 300 and the protrudent block 132 of the heat dissipating element 130, and two opposite surfaces of the heat conducting element 140 are connected to the electronic element 300 and the protrudent block 132, respectively. Since the heat conducting element 140 is made of a soft material, it can be attached to the protrudent block 132 of the heat dissipating element 130 and the electronic element 300. Thereby, a contacting thermal resistance between the protrudent block 132 of the heat dissipating element 130 and the electronic element 300 can be eliminated further to improve the heat dissipating function of the heat dissipating element 130 for the electronic element 300. In addition, a fan (not shown) can be assembled to generate a forced convection to improve the heat dissipating efficiency of the heat dissipating element 130.

Figure 3:
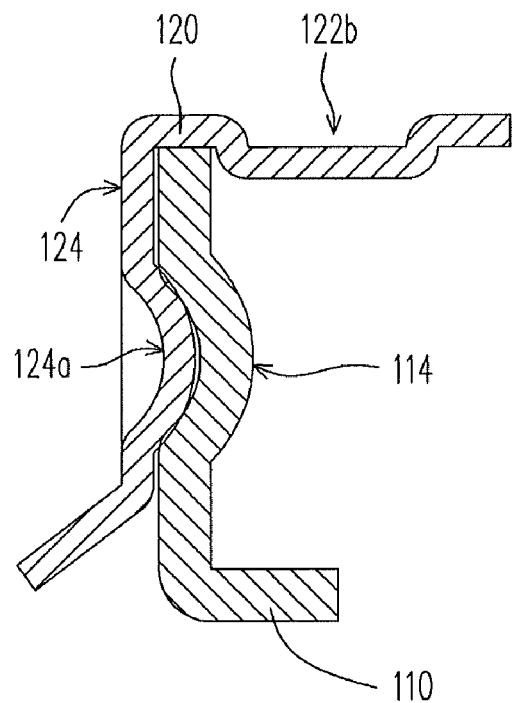
FIG. 3 is a partial section diagram showing the electromagnetic shielding device with a heat dissipating function in FIG. 1 when a frame is combined with a cover.

FIG. 3 is a partial section diagram showing the electromagnetic shielding device with the heat dissipating function in FIG. 1 when a frame is combined with a cover. Please refer to FIG. 3 and FIG. 1. The cover 120 has a recessed portion 122b formed near boarders of the top portion 122 and adjacent to the frame 110 so that the frame 110 is sandwiched between the recessed portion 122b and the side portion 124. In other words, the outer edge of the recessed portion 122b is adjacent to the combination place of the frame 110 and the side portion 124. That is, the distance between the outer edge of the recessed portion 122b of the cover 120 and the side portion 124 is designed according to the thickness of the frame 110, thus to tightly combine the frame 110 and the side portion 124. In this embodiment, the recessed portion 122b is a closed curve adjacent to the side portion 124 and boarders of the top portion 122.

Figure 4:
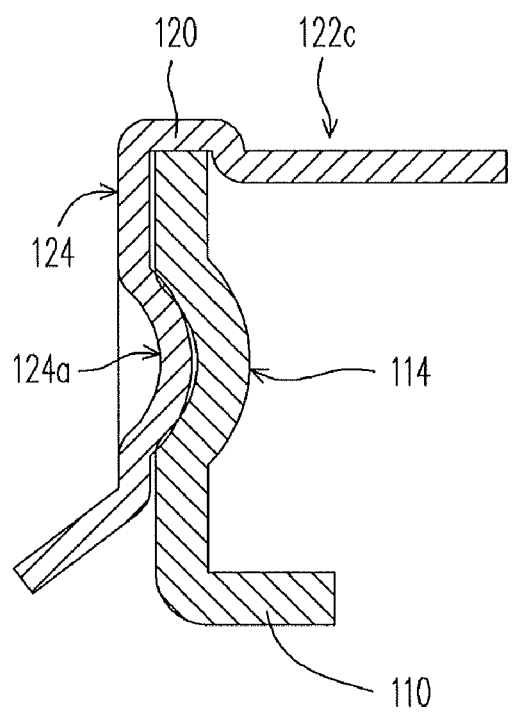
FIG. 4 is a partial section diagram showing an electromagnetic shielding device with a heat dissipating function when a frame is combined with a cover according to another embodiment of the invention.

FIG. 4 is a partial section diagram showing an electromagnetic shielding device with a heat dissipating function when a frame is combined with a cover according to another embodiment of the invention. Please refer to FIG. 4. In this embodiment, a recessed portion 122c of the cover 120 can be a dent surface at the top portion 122.

Please refer to FIG. 3 and FIG. 4 together. A side portion 124 has at least one first fastening portion 124a, and the frame 110 has at least one second fastening portion 114 fastened to the first fastening portion 124a. The second fastening portion 114 corresponds to and is fastened to the first fastening portion 124a. When the frame 110 and the cover 120 are combined, via the combination of the first fastening portion 124a and the second fastening portion 114 and the function of the recessed portion 122b or 122c, the frame 110 and the side portion 124 can be tightly combined.

To sum up, in the electromagnetic shielding device with a heat dissipating function in the embodiment of the invention, the electromagnetic shielding device has the seamless frame, and the frame and the cover can be tightly combined via the recessed portion and the fastening portion to form a shielding space with the circuit board. Therefore, the electromagnetic shielding device can effectively prevent electromagnetic waves from leaking outside or prevent external electromagnetic waves from permeating into the shielding space, thus to shield the electronic element inside.

In addition, the electromagnetic shielding device with the heat dissipating function further includes a heat dissipating element, thereby directly dissipating heat for the electronic element on the circuit board. Thus, the electromagnetic shielding device in the embodiment of the invention has the electromagnetic shielding function and the heat dissipating function together. In addition, the top portion of the cover may have an opening with the outline of a smooth closed curve for being combined with the protrudent block of the heat dissipating element, thereby being capable of avoiding gaps at the combination place.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electromagnetic shielding device with a heat dissipating function for shielding at least one electronic element on a circuit board, the electromagnetic shielding device comprising:
   a frame disposed on the circuit board and surrounding the electronic element, the frame being one-piece and seamless;
   a cover having a top portion, a recessed portion formed near borders of the top portion and adjacent to the frame, and a side portion bent from borders of the top portion, wherein the cover is combined with the frame, the top portion of the cover is connected to borders of the frame, and the side portion is tightly combined with the frame so that the frame is sandwiched between the recessed portion and the side portion, and the cover, the frame and the circuit board form a shielding space to surround the electronic element; and
   a heat dissipating element disposed on the top portion of the cover.

2. The electromagnetic shielding device with a heat dissipating function according to claim 1, wherein the top portion has an opening, the opening corresponds to the electronic element on the circuit board, and the outline of the opening is a smooth closed curve.

3. The electromagnetic shielding device with a heat dissipating function according to claim 2, wherein the opening is circular or elliptical.

4. The electromagnetic shielding device with a heat dissipating function according to claim 2, wherein the heat dissipating element has a protrudent block tightly embedded into the opening.

5. The electromagnetic shielding device with a heat dissipating function according to claim 4, further comprising a heat conducting element, two opposite surfaces of the heat conducting element connected to the electronic element and the protrudent block of the heat dissipating element, respectively.

6. The electromagnetic shielding device with a heat dissipating function according to claim 1, wherein the side portion has at least one first fastening portion, and the frame has at least one second fastening portion corresponding and fastened to the first fastening portion.

7. The electromagnetic shielding device with a heat dissipating function according to claim 1, wherein the electronic element comprises a central processing unit (CPU) with a tuning function.

8. The electromagnetic shielding device with a heat dissipating function according to claim 1, wherein the heat dissipating element is a heat dissipating fin.

* * * * *